United States Patent
Shilpiekandula et al.

(10) Patent No.: US 8,410,798 B2
(45) Date of Patent: Apr. 2, 2013

(54) FLEXURAL MECHANISM FOR PASSIVE ANGLE ALIGNMENT AND LOCKING

(75) Inventors: Vijay Shilpiekandula, Cambridge, MA (US); Justin Y. Lai, Cambridge, MA (US); Kamal Youcef-Toumi, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 294 days.

(21) Appl. No.: 12/841,448

(22) Filed: Jul. 22, 2010

(65) Prior Publication Data

US 2011/0037488 A1 Feb. 17, 2011

Related U.S. Application Data

(63) Continuation of application No. PCT/US2009/031656, filed on Jan. 22, 2009.

(60) Provisional application No. 61/022,602, filed on Jan. 22, 2008.

(51) Int. Cl.
*G01R 27/26* (2006.01)

(52) U.S. Cl. ........................................... 324/690

(58) Field of Classification Search .................. None
See application file for complete search history.

(56) References Cited

U.S. PATENT DOCUMENTS

| | | | | |
|---|---|---|---|---|
| 5,345,823 A | * | 9/1994 | Reidemeister et al. | .... 73/514.32 |
| 5,628,100 A | * | 5/1997 | Johnson et al. | ........... 29/25.41 |
| 7,117,790 B2 | | 10/2006 | Kendale et al. | |
| 7,946,029 B2 | * | 5/2011 | Rangelow | ........................ 29/759 |
| 2005/0140867 A1 | * | 6/2005 | Choi | .............................. 349/114 |
| 2009/0260213 A1 | * | 10/2009 | Shilpiekandula et al. | ...... 29/428 |
| 2009/0263531 A1 | * | 10/2009 | Shilpiekandula et al. | .... 425/150 |
| 2010/0116161 A1 | * | 5/2010 | Shilpiekandula et al. | . 101/407.1 |

FOREIGN PATENT DOCUMENTS

JP 2005208420 8/2005

OTHER PUBLICATIONS

Culpepper, Martin et al. "Design of a low-cost nano-manipulator which utilizes a monolithic, spatial compliant mechanism." Precision Engineering 28 (2004), pp. 469-482.

Tam, Michael et al. "Design and Development of a Multiple DOF Compliant Robot." 12th International Conference on Advanced Robotics, 2005. ICAR '05. Proceedings, Jul. 18-20, 2005, pp. 876-881.

Choi, B.J. et al. "Design of orientation stages for step and flash imprint lithography." Journal of the International Societies for Precision Engineering and Nanotechnology 25 (2001), pp. 192-199.

Gutierrez, Mauricio. "Size Adjustable Separation of Biologically Active Molecules." Massachusetts Institute of Technology, Department of Mechanical Engineering, 2004, pp. 1-117.

Woody, Shane et al. "Design and performance of a dual drive system for tip-tilt angular control of a 300 mm diameter mirror." Mechatronics 16 (2006), pp. 389-397.

(Continued)

*Primary Examiner* — Paresh Patel
(74) *Attorney, Agent, or Firm* — Gesmer Updegrove LLP

(57) ABSTRACT

A passive alignment structure is provided that includes at least one rigid post being coupled to a top surface and a bottom surface. At least one in-plane clamp is associated with a respective at least one rigid post. The at least one in-plane clamp receives a clamping force to lock the respective at least one rigid post. A plurality of pins allows the top surface to align to the bottom surface.

24 Claims, 9 Drawing Sheets

OTHER PUBLICATIONS

Choi, Y. et al. "Large Displacement Flexure Based Nano-Precision Motion Stage for Vacuum Environments." ASPE Proceedings, Oct. 2003, pp. 1-3.

Noll, T. et al. "The Monolithic Two Axis Flexure Joined Mirror Support and the Mechanical Design of the Infrared Beamline." 2nd International Workshop on Mechanical Engineering Design of Synchrotron Radiation Equipment and Instrumentation (MEDSI02), Sep. 2002, pp. 65-73.

Pham, Huy-Hoang et al. "Micro-Manipulator Design Based on Selectively Actuated Flexure Parallel Mechanisms." Robotics, Automation and Mechantronics, 2006 IEEE Conference. Jun. 2006, pp. 1-8.

Notification of Transmittal of the International Search Report and Written Opinion of the International Searching Authority mailed Jan. 22, 2009 in connection with PCT/US2009/031656.

* cited by examiner

FLEXURAL MECHANISM FOR PASSIVE ANGLE ALIGNMENT AND LOCKING

PRIORITY INFORMATION

The present application is a continuation of PCT Application No. PCT/US2009/031656, filed on Jan. 22, 2009, that claims priority to U.S. Provisional Application No. 61/022,602, filed on Jan. 22, 2008. Both applications are incorporated herein by reference in their entireties.

BACKGROUND OF THE INVENTION

The invention is related to the field of passive alignment, and in particular to precision-parallel alignment of surfaces brought in close proximity.

Alignment of angle between two surfaces brought into close proximity is critical in most nanomanufaeturing applications. As an example, tilt errors between a patterned tool and substrates in stamping applications such as micro-contact printing and hot-embossing can adversely affect uniformity of pattern replication. The micro-hot-embossing process is a type of forming used for creating polymer microfluidic channels. In this setup, the tool needs to align itself with the sample to create the 200 µm deep channels. Across a 1" wide area of the sample, with a 5-10% tolerance in channel height, approximately 400 µrad angular alignment is needed.

Other examples include small-scale gaps for applications in medical diagnostics, where a precision-parallel separation in the sub-100 nm to µm has to be achieved. Also, a programmable gap filter is designed and controlled for biologically active molecules.

Flexures have been used extensively in the prior art for positioning and alignment. Six degree-of-freedom flexure-based positioning and alignment fixtures had been designed. Passive alignment in robotic applications with flexure elements has also been used. A flexure-based alignment with conformal contact for step and flash imprint lithography has been designed. While the above technologies focused on passive alignment, none examined maintaining or locking the achieved orientation or alignment.

Epoxy-based locking of flexure units was proposed for passive alignment in prior art designs. However, epoxy-based locking is undesirable if the locking is irreversible. Further, it is hard to account for uniform hardening of epoxy in a confined volume and also, mismatch in thermal coefficients of expansion of the epoxy and flexure elements can result in warping and loss of alignment. In other cases, active feedback control of three degree of freedom, for example, vertical position, pitch and roll has been implemented in some previous designs. While active feedback control allows for robust alignment, they necessitate the use of multiple actuators and sensors. The overall resolution for the alignment is limited by the dynamic error performance of the sensors and the design of the control system.

SUMMARY OF THE INVENTION

According to one aspect of the invention, there is provided a passive alignment structure. The passive alignment structure includes at least one rigid post being coupled to a top surface and a bottom surface. At least one in-plane clamp is associated with a respective at least one rigid post. The at least one in-plane clamp receives a clamping force to lock the respective at least one rigid post. A plurality of pins allows the top surface to align to the bottom surface.

According to another aspect of the invention, there is provided a method of performing passive alignment comprising. The method includes coupling at least one rigid post to a top surface and a bottom surface. Also, the method includes positioning at least one in-plane clamp with a respective at least one rigid post. The at least one in-plane clamp receives a clamping force to lock the respective at least one rigid post. Furthermore, the method includes positioning a plurality of pins for allowing the top surface to align to the bottom surface.

DETAILED DESCRIPTION OF THE INVENTION

The invention involves a novel flexure-based design for passive alignment and subsequent mechanical locking. It focuses on the initial investigation of a planar implementation of the concept. Experimental results indicate that two surfaces can be aligned to within about 370 grad uncertainty. Finite element analysis on a proposed design alternative indicate an improvement to 25 grad uncertainty. The invention includes a precision-parallel alignment of surfaces brought in close proximity for nanomanufacturing applications. Passive alignment is desired as a simpler alternative to actively controlled designs. However, the challenge involved is locking the orientation formed between the surfaces to preserve the alignment.

In an exemplary embodiment of the invention, a piezoelectric actuator pushed down on a universal circular flexure in order to align a top surface to a bottom surface. The challenge is to lock the orientation achieved and then be able to actively control the height. Epoxy-based locking for maintaining the orientation of a surface is possible, but has the following limitations: (i) coefficient of thermal expansion mismatch can cause alignment errors and (ii) designs are limited since epoxy hardening is irreversible. In the invention, a new technique via mechanical locking is presented.

Figure 1:
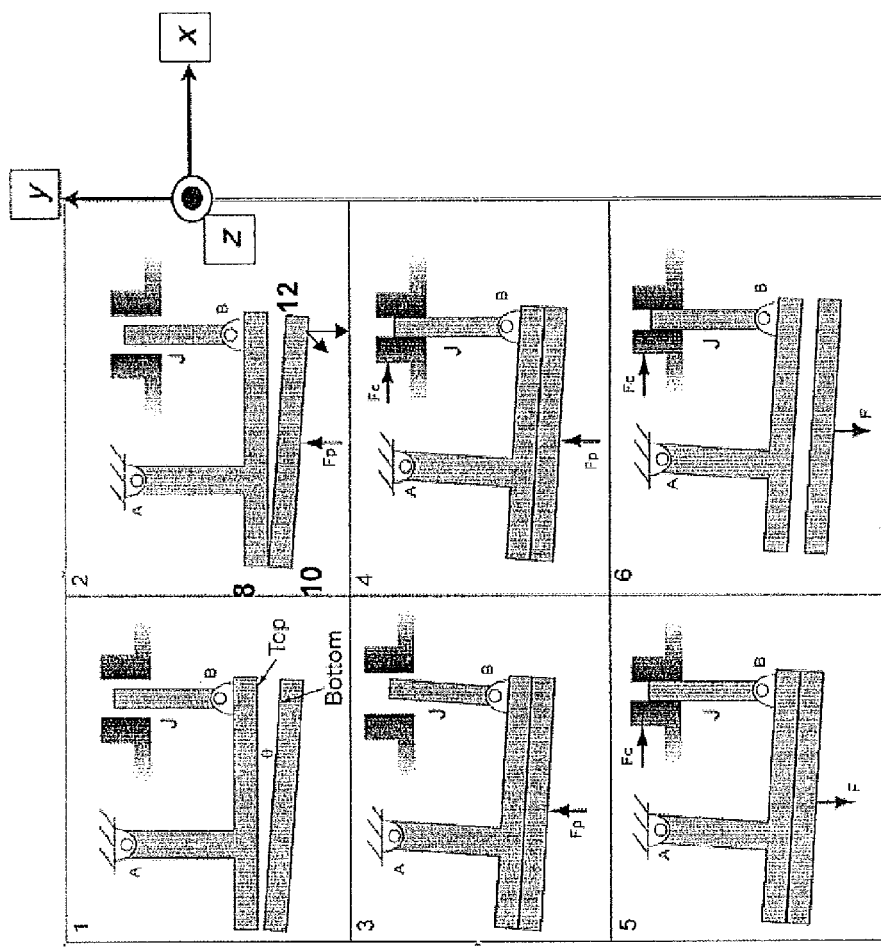
FIG. 1 includes schematic diagrams illustrating sequence of steps of the inventive concept for passive alignment and locking.

The inventive technique is illustrated by steps 1-6 in FIG. 1 for passive alignment of angle θ and subsequent locking. Step 1 shows a possible initial misalignment between the top 8 and bottom 10 surfaces. Step 2 shows a preload force, $F_p$, being applied to the bottom surface 10 in the y-axis. Between Steps 2 and 3, under conformal contact, pin joint A allows for the top surface 8 to align to the bottom surface 10.

Figure 2:
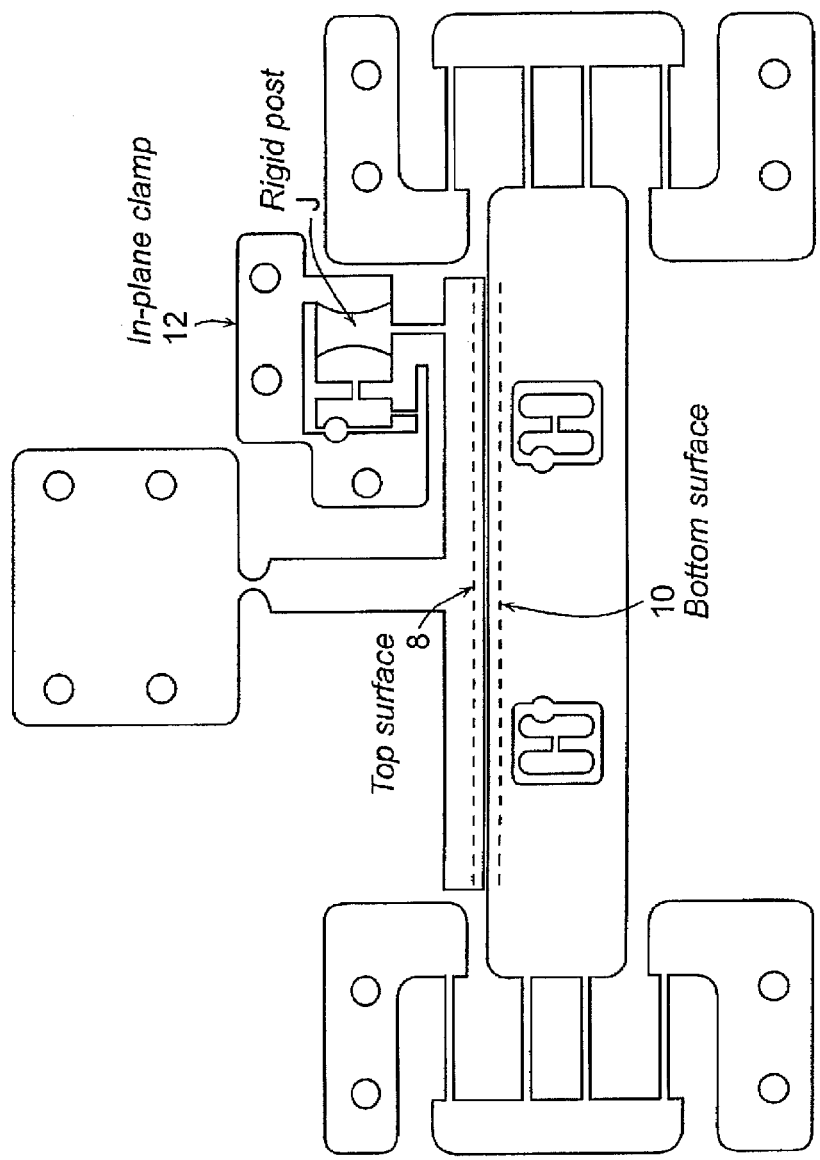
FIG. 2 is a schematic diagram illustrating the front view of a solid model of assembly used in accordance with the invention.

Subsequently, with the preload $F_p$ still applied, an in-plane clamp 12, as shown in FIG. 1 in steps 4-6, is used to apply force $F_c$ to lock the rigid post J, also shown in FIG. 2. Pin joint B allows for the clamping not to affect the angle of the top surface. Pin joints A and B will be described in further detail below. While a planar arrangement is considered here, the concept can be extended to alignment in three-dimensions. In this situation, three posts would be needed to fix both the pitch and roll of a surface.

This is one of many configurations to implement the concept. Alternative designs could, for instance, have the top surface moving instead of the bottom surface. FIG. 2 shows a front view of the setup used in the experiments, highlighting some of the design elements.

The following describes the design choices made to implement the proposed concept from FIG. 1. All of the flexural elements are highlighted in FIG. 3. The top surface 22 represents the tool and the bottom surface 24 represents the sample of stamping application. Flexures ensure for smooth and limited angular motion and allow the repeated use of the components, as long, as deformation stays within the elastic regime. For pin joint A from FIG. 1, a circular notch flexure is used. For motion of the bottom surface 24, two double compound parallelogram flexures 26 are used, to ensure motion only in the y-axis. For pin joint B from FIG. 1, a blade flexure is used. Finally, for the clamping of the post J, an in-plane clamp design 32, originally designed in to house capacitance probes 28, 30, is used to provide the clamping force $F_c$, shown in FIG. 1.

The flexures can be made out of aluminum, machined using the abrasive waterjet at a pressure of about 275 MPa. A micrometer head is used for moving the bottom surface 24 towards the top surface 22. It had a range of 0-13 mm and a resolution of 10 μm. For measuring the relative displacement between the top and bottom surfaces, ADE 2805 capacitance probes are used. The probes 28, 30 are rated to have a resolution on the order of 2 nm at a stand-off distance of 75-125 μm. This corresponded to an output voltage of ±10 V. Additionally, the top surface 22, which is the target of the capacitance probes 28, 30, is grounded to the chassis of the probe module 20 using pipe plugs 34. The capacitance probes 28, 30 are attached in-plane to the bottom surface using in-plane clamps 32. The output of the capacitance probe 28, 30 is connected to a dSpace DS 1103 platform to capture the data during the experiments.

Figure 3:
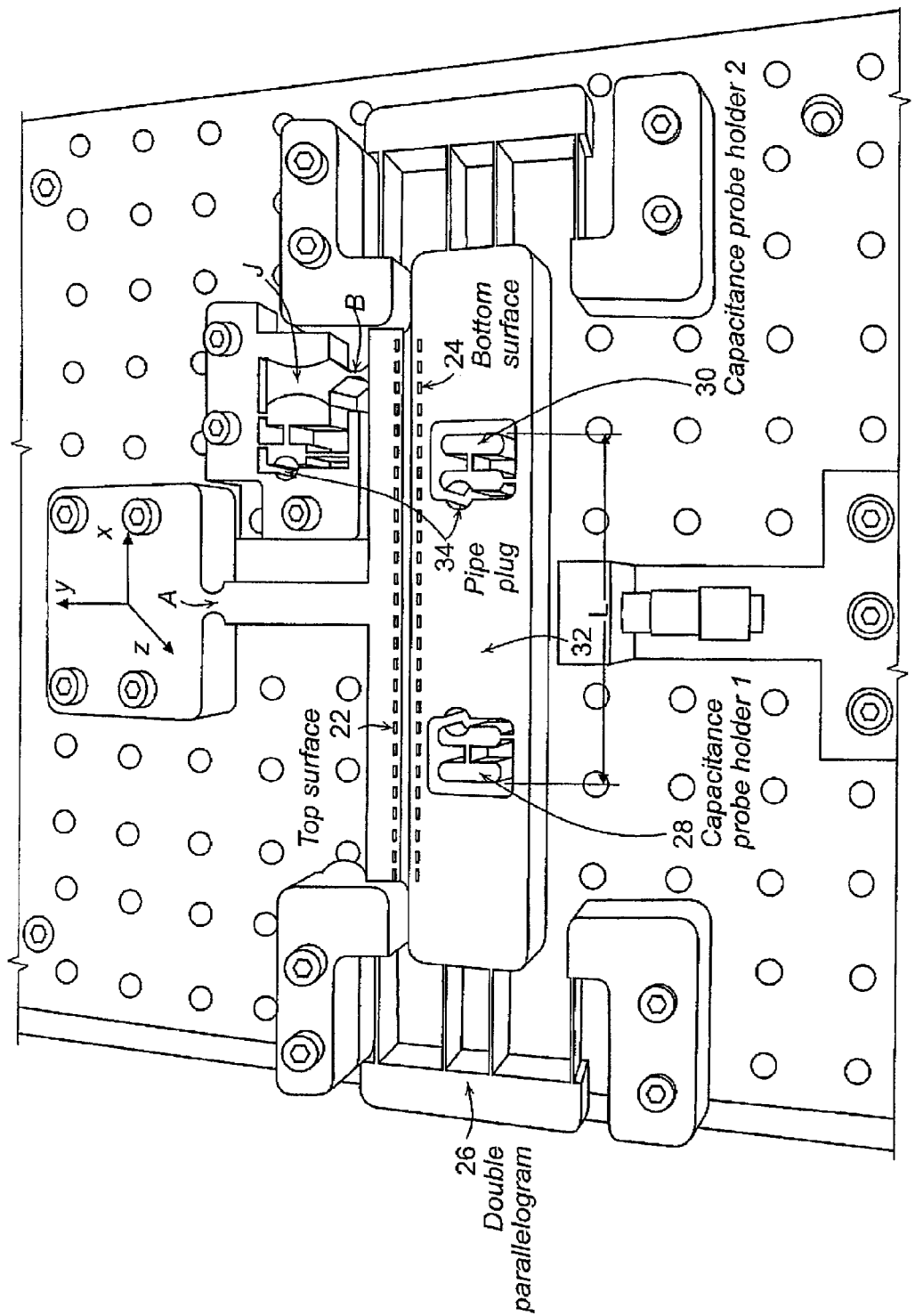
FIG. 3 is schematic diagram illustrating the flexural elements used in accordance with the invention.

The procedure adopted for the passive alignment and locking is as follows. First, the bottom surface is brought into conformal contact with the top surface via the micrometer head as a means of positioning. After a preset number of turns of the micrometer head that ensured conformal contact occurred, a pipe plug is used to tighten an in-plane clamp, as indicated in FIG. 3, thus locking the post. Then, the capacitance probes are brought within standoff distance. Once initial voltage readings of the probes are recorded, the preload force given by the micrometer head, represented by $F_p$ in FIG. 1, is released to move the bottom surface backwards. The capacitance probes captured the transient behavior of the top surface, with respect to the movement of the bottom surface. Thus, the capacitance probes indicated the change in orientation of the top surface as the bottom surface moved backwards.

The capacitance probes are fixed to the optical breadboard, undergoing no motion during the experiment. Clearance holes in the bottom surface allowed for the capacitance probes to be brought within standoff distance from the top surface. However, to avoid fringe-field based artifacts, a new bottom positioning unit is created so that the capacitance probes would be housed in-plane, as shown in FIG. 3. With this revised configuration, capacitance probes measure the relative displacement between the top and bottom surfaces as they are brought into contact and away from each other.

Figure 4:
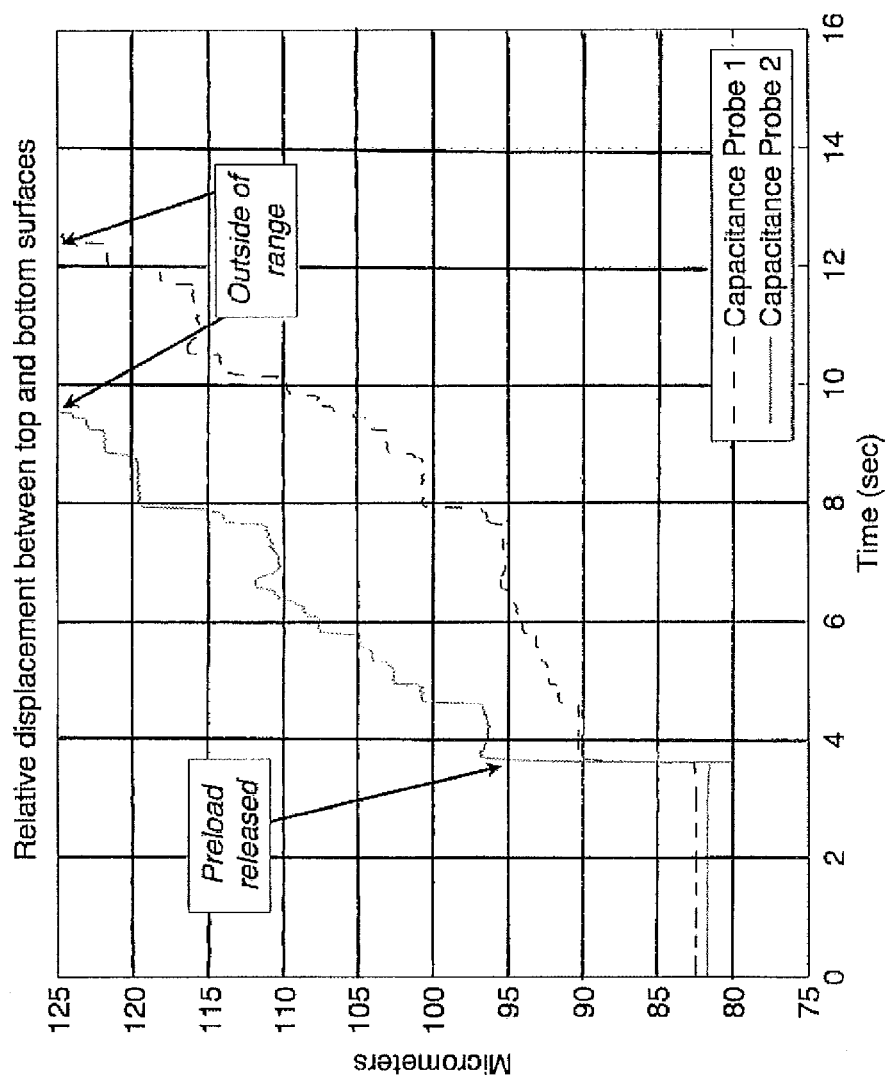
FIG. 4 is a graph illustrating data acquired as the preload force used in accordance with the invention.
Figure 5:
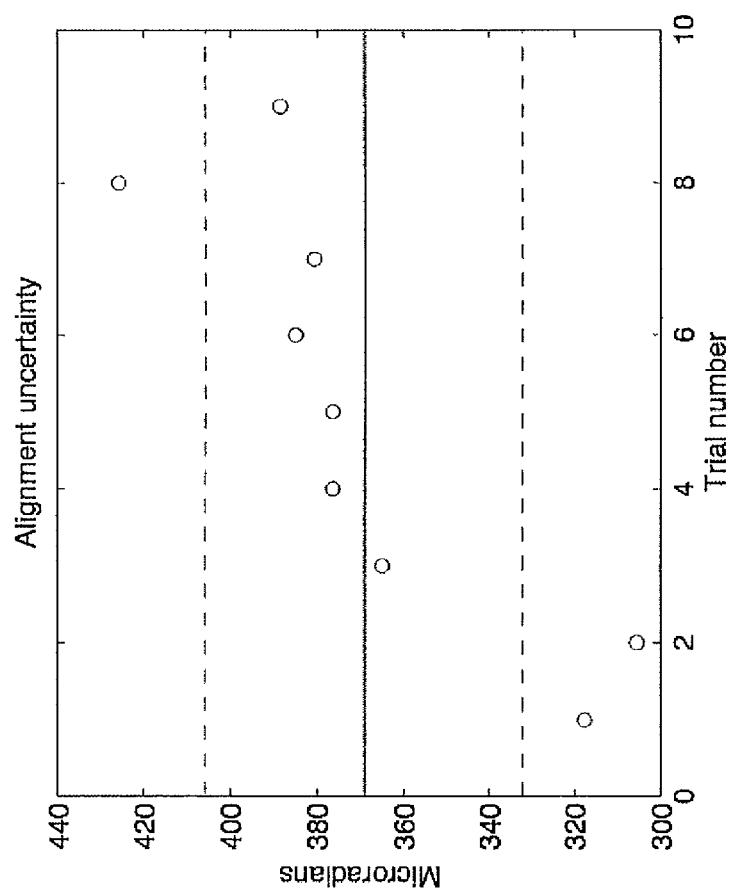
FIG. 5 is a graph illustrating results of trials for measuring alignment uncertainty

The alignment uncertainty as estimated from experiments is on the order of 370 grad. This is based off of 9 trials. The results of the 9 trials are shown in FIG. 4. FIG. 5 shows data from the capacitance probes, acquired as the preload force from the bottom micrometer head is released. Each of the two traces corresponds to one of the two capacitance probes. In order to find the orientation of the top surface after the bottom surface is released, the difference between the two traces in FIG. 5 is taken and divided by the distance in the x-axis between the two probes, marked L in FIG. 3. The difference is taken at a time immediately before either of the two traces goes out of range. For the particular trial in FIG. 5, the out of range locations are highlighted. Each trial produced a similar to the one shown in FIG. 5.

The measurement of interest is the deviation of the angle from the conformed orientation. The initial orientation, after conformal contact and locking of the rigid post, is measured in the same manner as the final orientation, but at the time before the preload force is released. This is highlighted in FIG. 5. The alignment uncertainty for a given trial is thus the change in orientation of the top surface before and after the preload force, F is released.

The results indicate that this technique of alignment in its current implementation can achieve an angle alignment between two surfaces within an uncertainty of 370 μrad. Stamping applications mentioned herein can be implemented using designs based on this technique of passive alignment and locking. In its current form, this setup has shown promise for further study as a candidate design for stamping applications. The large uncertainty limits its use in small-gap applications that require high-precision angular alignment. While closed-loop control designs are probably more robust for such stringent applications, the passive technique suggested here can be a simple low-cost solution for achieving a reasonable degree of precision in alignment. An error analysis of this design allowed us to address reduction of alignment uncertainty.

Figure 6:
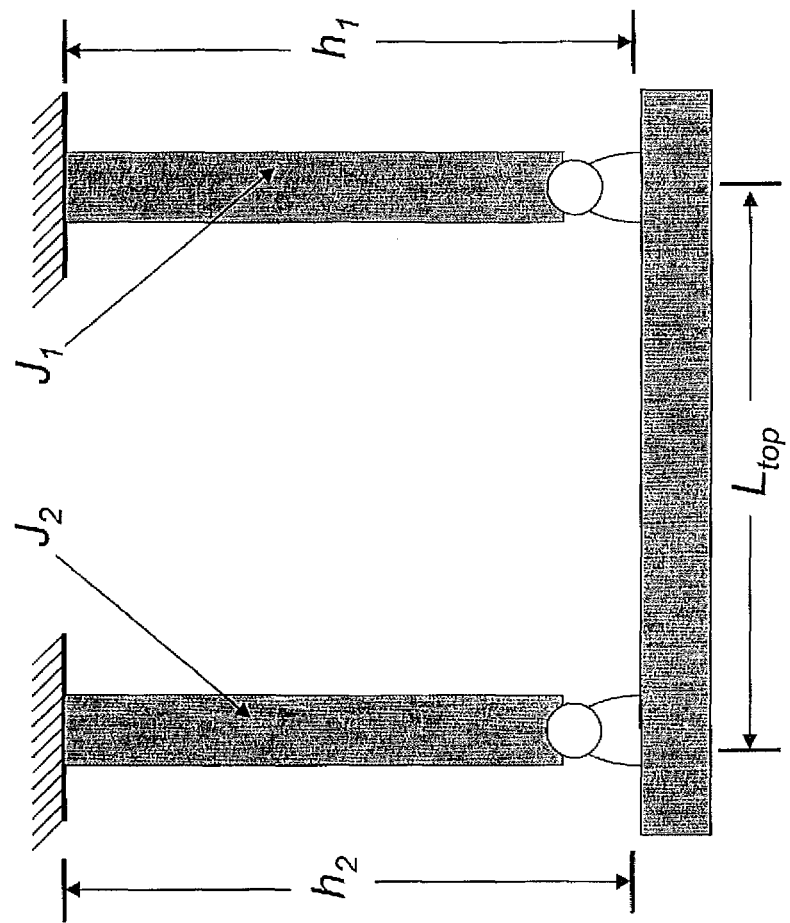
FIG. 6 is a schematic diagram used for an error analysis used in accordance with the invention.

An error analysis is provided considering the possible sources of error for the experimental setup and any subsequent modified design. Finite element analysis on a new proposed design predicts an angular alignment uncertainty of 25 μrad and the effect of temperature fluctuation in a first-order approximation predicts an additional angular alignment uncertainty of 16 μrad. FIG. 6 shows the height h1 and h2 of the two posts, J1 and J2, and the distance $L_{top}$ in between them. Equation (1) shows the effect of changes in height to the overall angle θ of the surface defined by the two heights $$\delta\theta = \frac{\delta h_1 + \delta h_2}{L_{top}} \qquad \text{EQ. 1}$$

The axial compliance of the circular notch flexure, or pin joint A in FIG. 1 contributes to the angular alignment uncertainty. Flexures are chosen as the implementation of pin joint A to provide smooth, small-scale, repeatable motion. However, when the preload force, $F_c$, is released, pin joint A tends to return to its original length. This effect can be explained from the limited axial stiffness of the circular notch flexure, which is the implementation of pin joint A.

Figure 7:
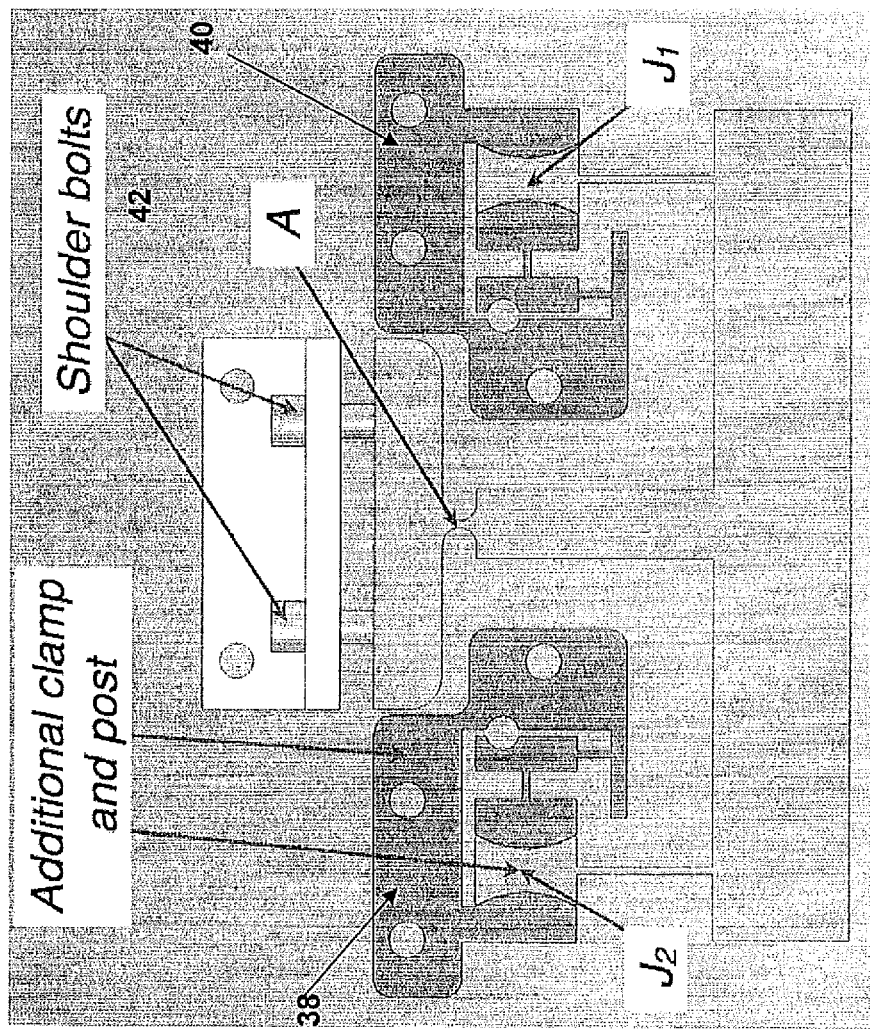
FIG. 7 is schematic diagram illustrating a different embodiment of the invention.

In order to reduce this effect, a new design 36 is shown in FIG. 7. This design 36 uses an additional in-plane clamp 38 and rigid post J2, clamped in the same manner as the right-hand side with in-plane clamp 40 and rigid post J1. In this arrangement, two shoulder bolts 42 anchor pin join A. In this setup, pin joint A is always fixed to the ground. The shoulder bolts 42 in FIG. 7 release the fixed condition of pin joint A. With pin joint A being released, another height is needed to define the plane of the top surface. This is done with the addition of the in-plane clamp 38 and rigid post J2 on the left-hand side.

Figure 8:
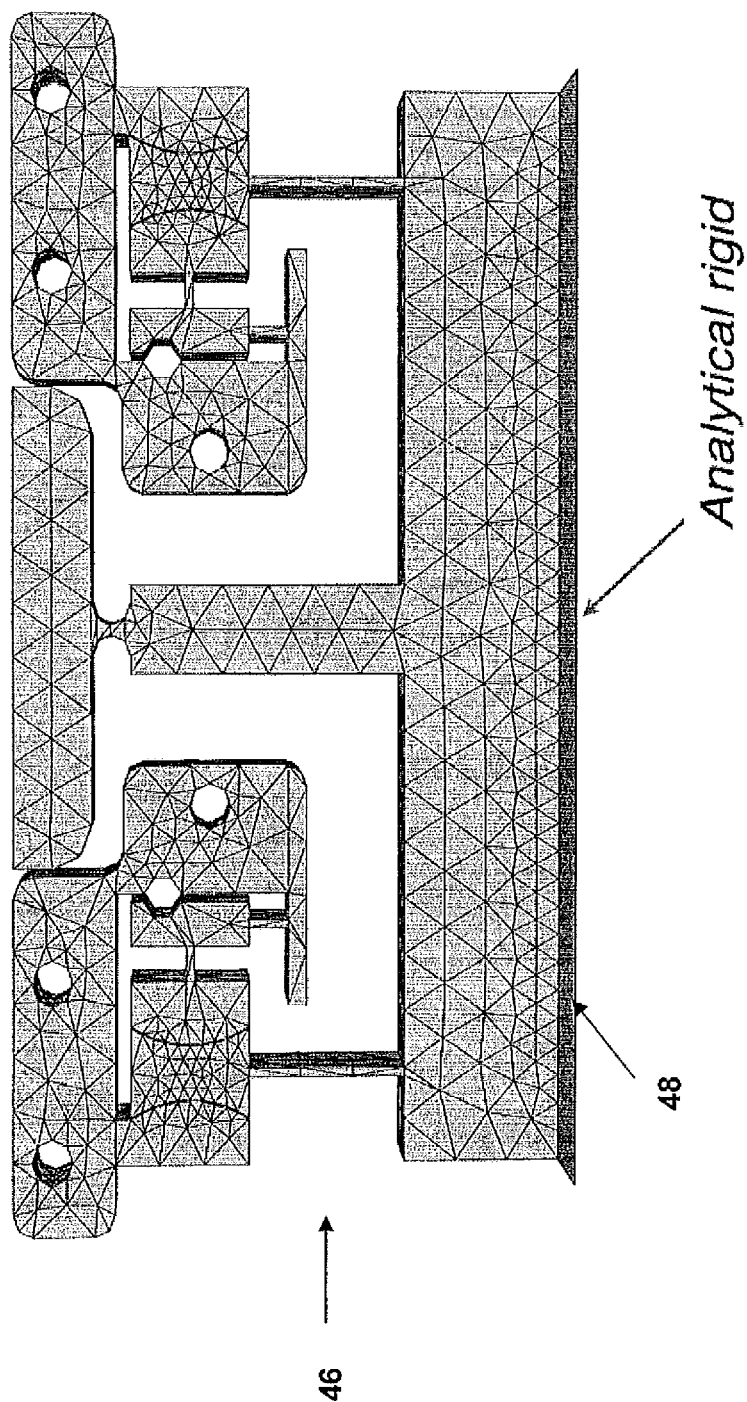
FIG. 8 is a schematic illustrating a finite element mesh used in accordance with the invention.

A finite element analysis is performed on the new model 36 in FIG. 7 to take into consideration the effect of springback in the system. In the new proposed design 36, the effect of pin joint A is reduced because of the additional step removing the fixed constraint. FIG. 8 shows the finite element mesh 46 used for the simulation of the new design. The boundary conditions are set to simulate the experiments. The bottom surface 48 should be rotationally stiff in $\theta_z$ so that it does not change its orientation as it comes in contact with the top surface. Thus, it is modeled as an analytical rigid. It is assigned a misalignment of 1 mrad. This angle would be the orientation to which the top surface would conform.

Figure 9:
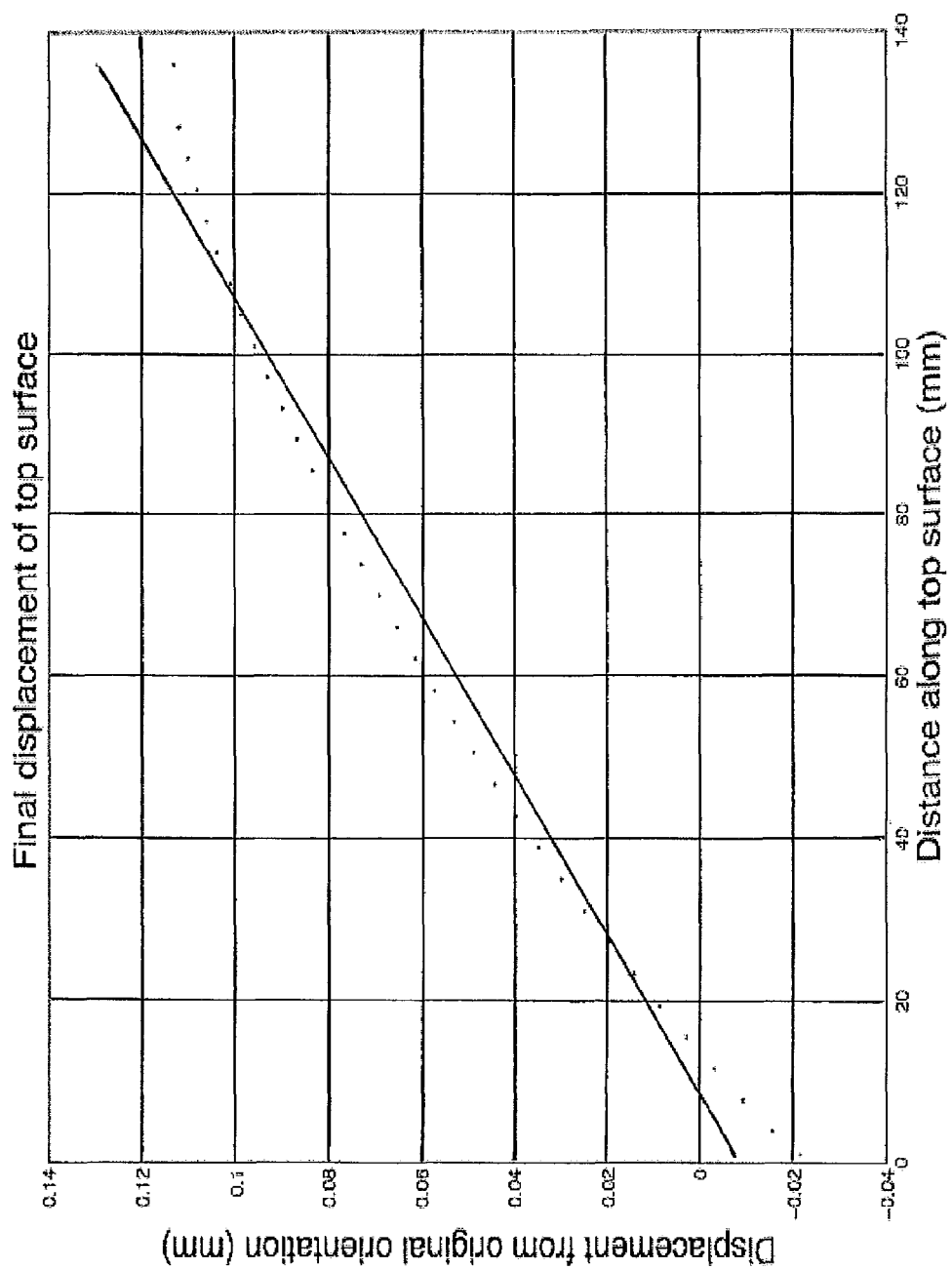
FIG. 9 is a graph illustrating final displacement of top surface nodes after the preload force of a bottom surface.

After the analysis is completed, nodes are selected from the top surface to determine the final orientation of the top surface. FIG. 9 shows the final orientation of the nodes along the top surface after the preload force, Fc is released. The top surface 8 in the beginning, similar to Step 1 of FIG. 1 is horizontal with respect to the x-axis. The slope of the best-fit line is 1025 µrad, representing the final orientation of the top surface 8. This is a deviation of 25 µrad from the original angle of 1000 µrad or 1 mrad of the bottom surface 10. This preliminary simulation shows an angular alignment uncertainty of 25 µrad, compared to the experimental result of 370 µrad. The experimental result is obtained with the design using only one post.

Variation in temperature in space and time could affect the measurement. First, the sensors can be sensitive to this change. Second, depending on the coefficient of thermal expansion for the material of the system, additional displacement could occur. This can in turn change the orientation of the top surface. This is given by Equation (2)

$$\Delta h = \alpha \Delta T h_0 \qquad \text{EQ. 2}$$

where is the coefficient of thermal expansion and $\Delta T$ is the variation in temperature, $\delta h$ is the deformed length and $h_0$ is the initial length.

For the following values, $\Delta h$ is $1.02 \times 10^{-6}$ m: $\Delta T$ of 1° C., for aluminum, $2.3 \times 10^{-5}$ C.$^{-1}$, $h_0$ of $4.45 \times 10^{-2}$ m.

Taking this value of $\Delta h$ and the distance between the two posts, $L_{top}$, $1.27 \times 10^{-1}$ m, the approximate change in orientation of the top surface due to temperature fluctuation, $\delta \theta$, is 16 µrad.

The error analysis of the new design is an angular alignment uncertainty of 41 µrad, considering finite element analysis and a first-order temperature calculation.

The clamping force, $F_p$, as shown in FIG. 1 can cause a moment on the top surface 8. The curvature seen in the simulation results in FIG. 9 shows the effect of moments on the top surface from the clamping. Increasing the distance between the two posts, J1 and J2 and the length of the blade flexure, pin joint B, and increasing the thickness of the top surface could reduce the effect of the in-plane clamps. Lengthening the blade flexure and thickening the top surface is reflected in FIG. 7. These improvements can be made with additional optimization in finite element analysis.

The invention can also include having at least three or more rigid posts to align both the pitch and roll angles between the top and bottom surface.

Also, different materials can be used for the flexural elements having different combinations of thermal and mechanical properties. Considerations need to be made with regards to the compatibility of the material of the flexural elements and the interface with a given application. Materials with low coefficient of thermal expansion such as invar are ideal candidates for flexural elements. Further, thermal symmetry can be incorporated in the design to minimize the disparities in coefficients of thermal expansion.

The invention provides alignment between two surfaces and subsequent locking for nanomanufacturing applications. The invention presents an implementation of the proposed concept shown in FIG. 1. The results have shown an alignment uncertainty on the order of 370 µrad, which can allow for 5-10% tolerance in feature uniformity of 100-200 µm channels in microfluidics manufacturing. The springback from the main central notch contributes significantly to the angular alignment uncertainty. An alternative design is provided with an addition of or more posts symmetric to the center line. This provides for the release of the central circular notch flexure, reducing the effect of springback.

The invention thus allows for the initial misalignment to be compensated and parallelism is ensured by mechanical locking to achieve a uniform gap. Hence the performance of only a one degree-of-freedom vertical positioning actuator, sensor and associated control system for active feedback control of the gap separation is relied upon.

Although the present invention has been shown and described with respect to several preferred embodiments thereof, various changes, omissions and additions to the form and detail thereof, may be made therein, without departing from the spirit and scope of the invention.

What is claimed is:

1. A passive alignment structure comprising:
   at least one rigid post being coupled to a top surface and a bottom surface
   at least one in-plane clamp associated with a respective at least one rigid post, said at least one in-plane clamp receives a clamping force to lock said respective at least one rigid post; and
   a plurality of pins for allowing the top surface to align to the bottom surface.

2. The passive alignment structure of claim 1, wherein said at least one in-plane clamp comprises one in-plane clamp.

3. The passive alignment structure of claim 1, wherein said at least one in-plane clamp comprises two in-plane clamps.

4. The passive alignment structure of claim 1, wherein said at least one rigid post comprises one rigid post.

5. The passive alignment structure of claim 1, wherein said at least one rigid post comprises two rigid posts.

6. The passive alignment structure of claim 1, wherein said pins comprise circular notch flexure.

7. The passive alignment structure of claim 1, wherein said pins comprise blade flexures.

8. The passive alignment structure of claim 1, wherein said at least one in-plane clamp comprises displacements sensors such as capacitance probes.

9. The passive alignment structure of claim 1, wherein said top surface comprises a tool structure.

10. The passive alignment structure of claim 1, wherein said bottom surface comprises a stamping structure.

11. A method of performing passive alignment comprising:
    coupling at least one rigid post to a top surface and a bottom surface positioning at least one in-plane clamp with a respective at least one rigid post, said at least one in-plane clamp receives a clamping force to lock said respective at least one rigid post; and positioning a plurality of pins for allowing the top surface to align to the bottom surface.

12. The method structure of claim 11, wherein said at least one in-plane clamp comprises one in-plane clamp.

13. The method structure of claim 11, wherein said at least one in-plane clamp comprises two in-plane clamps.

14. The method structure of claim 11, wherein said at least one rigid post comprises one rigid post.

15. The method structure of claim 11, wherein said at least one rigid post comprises two rigid posts.

16. The method structure of claim 11, wherein said pins comprise circular notch flexure.

17. The method structure of claim 11, wherein said pins comprise blade flexures.

18. The method structure of claim 11, wherein said at least one in-plane clamp comprises capacitance probes.

19. The method structure of claim 11, wherein said top surface comprises a tool structure.

20. The method structure of claim 11, wherein said bottom surface comprises a stamping structure.

21. The method structure of claim 20, wherein said pins allow to align bottom surface against a top surface.

22. The method structure of claim 20, wherein the said planar arrangement is extended to alignment in three-dimensions.

23. The method structure of claim 22, wherein said at least one rigid post comprises at least three rigid posts to align both the pitch and roll angles between the top and bottom surface.

24. The method structure of claim 23, with an addition of posts symmetric to the center line, which allows for the release of the central circular alignment pin or notch flexure, and hence reduces the effect of springback.

* * * * *